United States Patent [19]

Mazumder

[11] Patent Number: 4,628,216
[45] Date of Patent: Dec. 9, 1986

[54] MERGING OF LOGIC FUNCTION CIRCUITS TO ECL LATCH OR FLIP-FLOP CIRCUIT

[75] Inventor: Nikhil C. Mazumder, San Jose, Calif.

[73] Assignee: Advanced Micro Devices, Inc., Sunnyvale, Calif.

[21] Appl. No.: 628,706

[22] Filed: Jul. 9, 1984

[51] Int. Cl.[4] .......................................... H03K 19/086
[52] U.S. Cl. .................................... 307/455; 307/291; 307/467
[58] Field of Search ............... 307/463, 448, 455, 465, 307/466, 467, 254

[56] References Cited

U.S. PATENT DOCUMENTS 4,258,274  3/1981  Nagashima et al. ................ 307/254

Primary Examiner—Stanley D. Miller
Assistant Examiner—M. R. Wambach
Attorney, Agent, or Firm—Patrick T. King; Davis Chin; J. Vincent Tortolano

[57] ABSTRACT

A combination circuit formed of a functional portion circuit coupled to a latch or flip-flop circuit portion which is fabricated as a single gate on an integrated circuit semiconductor chip. The functional circuit portion can be a multiplexer, or other logic functions such as AND, NAND, OR, NOR, XOR, etc. A special buffer circuit is provided which generates a latch enable signal for the latch or a clock signal for the flip-flop in the combination circuit. The latch enable signal or the clock signal for the combination circuit has to override the high level values of the normal second level ECL signals while their low level values can be the same as those of normal second level ECL signals. This combination circuit has the advantage of higher speed, lower power consumption, and reduced component counts which is favorable for integrated circuits.

11 Claims, 5 Drawing Figures

MERGING OF LOGIC FUNCTION CIRCUITS TO ECL LATCH OR FLIP-FLOP CIRCUIT

BACKGROUND OF THE INVENTION

1. Field of the Invention

This invention relates generally to semiconductor circuits and more particularly, it relates to merging of a multiplexer circuit or other logic function circuits to a latch circuit or a flip-flop circuit which is formed as a single gate on an integrated circuit semiconductor chip for high speed operation.

2. Description of the Prior Art

In general, there are many circuit applications in which a multiplexer circuit or other logic function circuits such as AND, NAND, XOR, OR, NOR, etc., are required to be followed by a latch or flip-flop circuit. For example, the data input selected by a multiplexer circuit from different circuits are usually stored in a latch or flip-flop circuit. Typically, this is implemented by the use of two separate and distinct gate circuits. The two gates of the multiplexer circuit and latch circuit of the prior art as shown in FIG. 1(a) and 1(b) are then connected in cascade. These prior art circuits have the disadvantages of increased power consumption and increased number of circuit components and a lower operating speed due to the propagation time delay in using two separate gates.

It would thus be desirable to provide a combination multiplexer circuit or other logic function circuit and a latch or flip-flop circuit which are formed as a single gate on an integrated circuit semiconductor chip, thereby increasing the efficiency and speed of operation.

SUMMARY OF THE INVENTION

Accordingly, it is a general object of the present invention to provide for the merging of a functional circuit to a latch or flip-flop circuit so as to obtain an improved combined circuit which is formed as a single gate on an integrated circuit semiconductor chip for high speed operation. The functional circuit can be a multiplexer or other logic functions such as AND, NAND, OR, NOR, XOR, etc.

It is also an object of the present invention to provide a special buffer circuit to generate latch enable or clock signals for the combination circuit.

It is another object of the present invention to provide a method of reducing gate delays.

It is still another object of the present invention to provide a combination circuit which has a reduced speed-power product. It is further an object of the present invention to provide a method for reducing component counts, and for providing a higher packing density favorable to integrated circuitry.

In accordance with these aims and objectives, the instant invention is concerned with the provision of a combination circuit formed of a functional circuit portion coupled to a latch circuit portion which is fabricated as a single gate on an integrated circuit semiconductor chip. The latch circuit portion includes a pair of first and second latch transistors whose emitters are commonly connected together. The bases of the first and second transistors are adapted to receive input signals from a functional circuit portion. A latch enable transistor has its collector tied to the common emitters of the first and second latch transistors, its emitter connected to a first current source, and its base connected to a latch enable terminal. A true output transistor has its base connected to the collector of the first latch transistor, its collector connected to a supply potential, and its emitter coupled to a true output signal terminal. A complementary output transistor has its base connected to the collector of the second latch transistor, its collector connected to the supply potential, and its emitter coupled to a complementary output signal terminal. The emitter of the true output transistor is connected to the base of the second latch transistor and to a second current source, and the emitter of the complementary output transistor is connected to the base of the first latch transistor and to a third source. The functional circuit portion has its output coupled to the bases of the first and second latch transistors to provide the input signals. A master circuit portion of the functional circuit is connected to the latch circuit to form a flip-flop circuit. A clock buffer circuit is provided which generates a clock signal for the flip-flop circuit.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
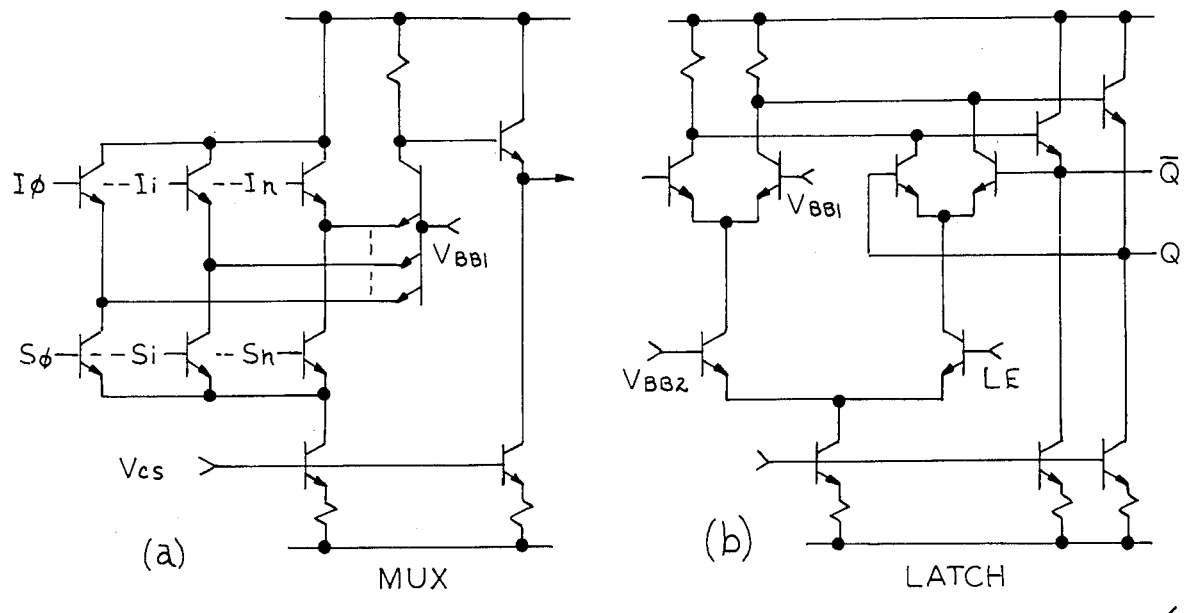
FIG. 1(a) and (b) illustrate the two gates of a multiplexer circuit and a latch circuit of the prior art.
Figure 2:
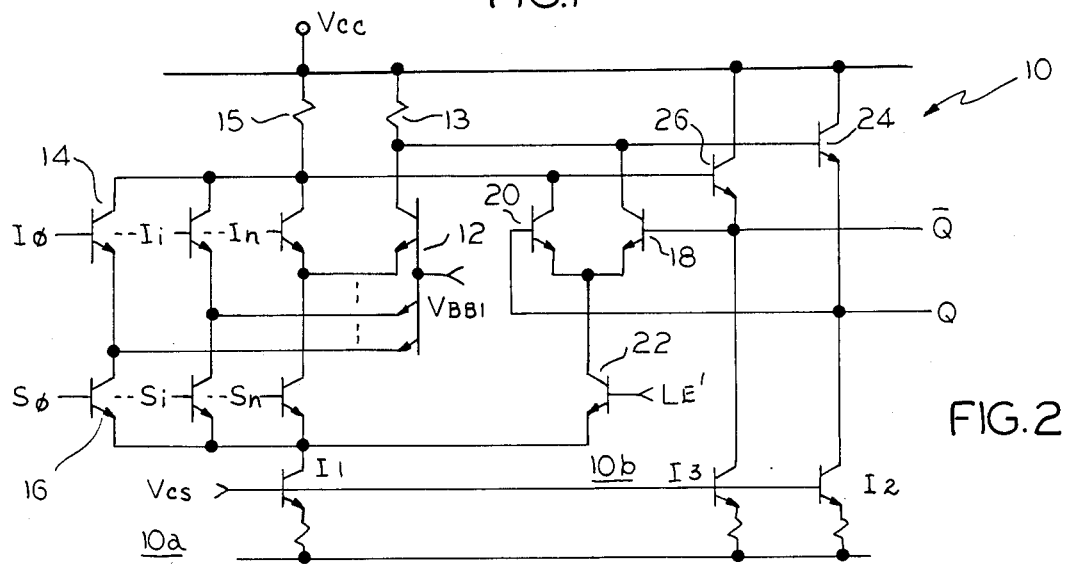
FIG. 2 is a schematic diagram of a combined multiplexer and latch circuit of the present invention which has been merged into a single gate.

Referring now in detail to the various views of the drawings, there is shown in FIG. 2 a combined multiplexer and latch circuit 10 of the present invention which has been merged into a single gate. The combined circuit 10 is formed on an integrated circuit substrate of a semiconductor chip. The multiplexer circuit portion 10a of the combined circuit includes a reference transistor 12 which has a base, a collector, and a plurality of emitters. The collector of the transistor 12 is connected to a supply voltage or potential $V_{CC}$ via a first load resistor 13. The base of the transistor 12 is connected to a reference $V_{BB1}$. A plurality of data input transistors 14 is provided whose collectors are commonly tied together and are further coupled to the supply potential $V_{CC}$ via a second load resistor 15. Each of the bases of the transistors 14 are connected to input terminals for receiving respective data signals $I_0 \ldots I_n$. A plurality of control transistors 16 has its emitters commonly tied together, which emitters are further joined to a current source 11. Each of the bases of the control transistor 16 are connected to respective control terminals for receiving control signals $S_0 \ldots S_n$. The respective emitters of the data input transistors 14 are connected to respective collectors of the control transistors 16. The respective junctions of the common emitter-collector of transistors 14 and 16 are further coupled to the respective emitters of the reference transistor 12.

The latch circuit portion 10b of the combined circuit includes a pair of latch transistors 18 and 20 whose emitters are commonly tied together and further tied to the collector of a latch enable transistor 22. The emitter of the enable transistor 22 is connected to the common emitters of the control transistor 16. The base of the enable transistor 22 is connected to an enable terminal for receiving an enable signal LE'. The collector of the first batch transistor 18 is coupled to one end of the first load resistor 13 and to the base of a true output transistor 24. The collector of the transistor 24 is tied to the supply potential, and the emitter of the transistor 24 is coupled to a true output terminal Q, a current source 12, and back to the base of the second latch transistor 20. The collector of the transistor 20 is coupled to one end of the second load resistor 15 and to the base of a complementary output transistor 26. The collector of the transistor 26 is tied to the supply potential, and the emitter of the transistor 26 is coupled to a complementary output terminal $\overline{Q}$, a current source 13 and back to the base of the first latch transistor 18.

Figure 3:
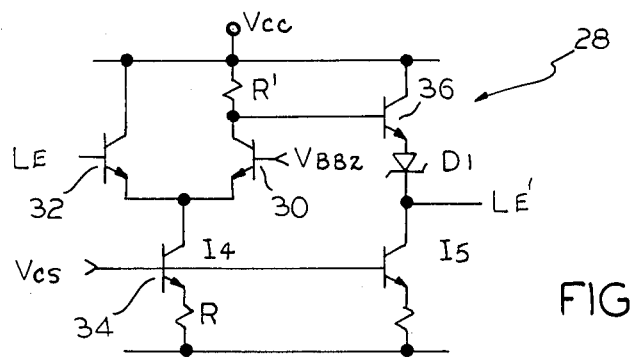
FIG. 3 is a schematic diagram of a latch enable buffer circuit for the combined circuit of FIG. 2.

In order to generate the enable signal LE', there is provided a latch enable buffer circuit 28 which is illustrated in FIG. 3 of the drawings. The buffer circuit 28 includes a differential transistor circuit formed of transistors 30 and 32 whose emitters are commonly connected together. The transistor 30 has its collector connected to a supply potential $V_{CC}$ via a load resistor R', and the base of the transistor 30 is connected to a reference voltage $V_{BB2}$. The transistor 32 has its collector connected to a supply potential $V_{CC}$ and its base connected to a terminal for receiving a latch enable signal LE. A current source 14 is connected to the common emitters of the transistor 30 and 32. The current source 14 is formed by a transistor 34 and an emitter resistor R. The junction of the load resistor R' and the collector of the transistor 30 is tied to the base of an emitter follower transistor 36. The collector of the transistor 36 is connected to the supply potential. The emitter of the transistor 36 is coupled to an output terminal via a diode D1 to provide the enable signal LE' for the circuit of FIG. 2. A current source 15 is connected to the cathode of the diode D1.

Since the latch enable signal LE' has to override the high level value of the control signals $S_0 \ldots S_n$, it has been determined that the ratio of the load resistor R' to the emitter resistor R should be approximately equal to 1.5. As can be seen, the high level voltage of the enable signal LE' is equal to the supply potential $V_{CC}$ less the sum of voltage drops across the base-emitter junction of transistor 36 and the diode D1.

Figure 4:
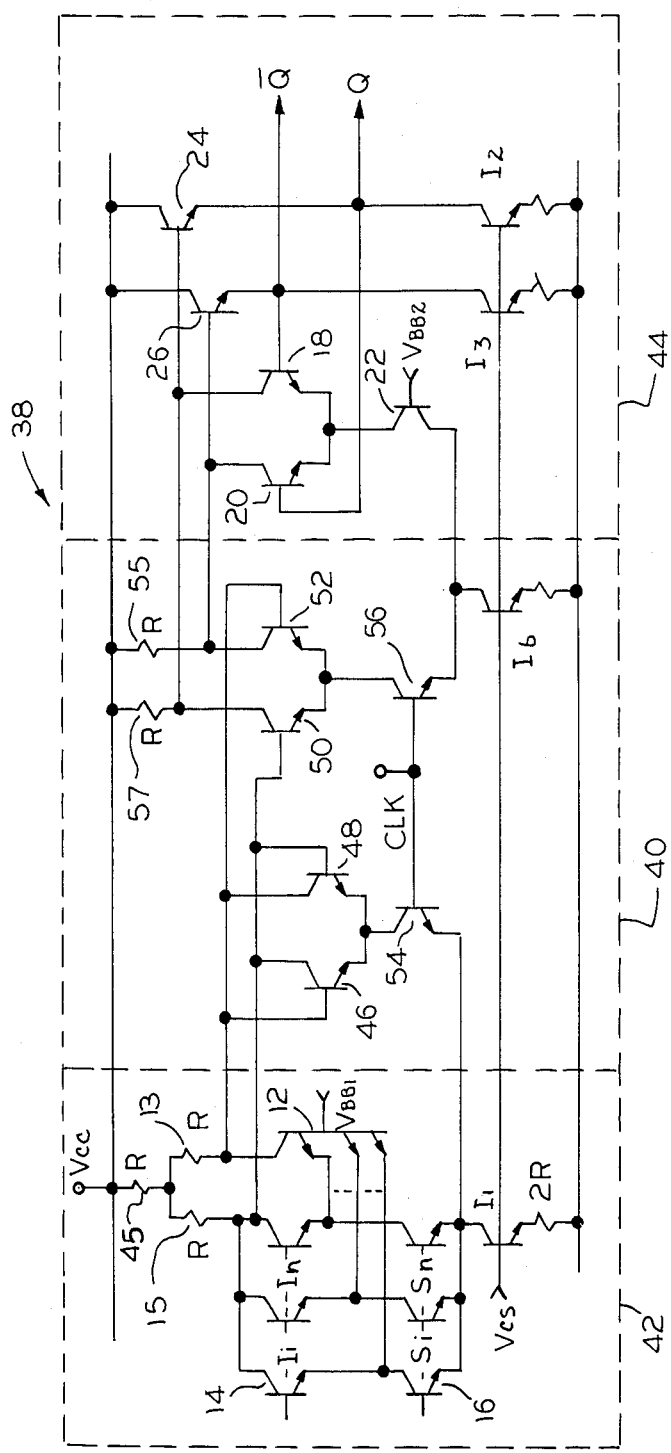
FIG. 4 is a schematic diagram of a combined multiplexer and flip-flop circuit of the present invention.

A combined multiplexer and flip-flop circuit of the present invention is illustrated in FIG. 4 which is formed on an integrated circuit substrate of a single semiconductor chip. A master circuit portion or section 40 is inserted between a multiplexer circuit 42 and a latch (i.e. slave) circuit portion 44. The master circuit portion 40 has its inputs coupled to the outputs of the multiplexer circuit 42 which serves as a functional circuit portion. The outputs of the master circuit portion 40 are coupled to the inputs of the latch circuit portion 44. The master circuit portion 40 and the latch circuit portion 44 are defined to be a flip-flop circuit 38.

The multiplexer circuit 42 is similar to the multiplexer circuit portion 10a of the circuit in FIG. 2, except that its output levels are changed by a level shifting resistor 45. The latch circuit 44 is similar to the latch circuit portion 10b of the circuit in FIG. 2, except that the signal LE' is replaced with a second reference potential $V_{BB2}$. Thus, a detailed description of the interconnections of the components in the multiplexer circuit 42 and the latch circuit 44 is not believed to be necessary.

The master circuit section 40 consists of a pair of first stage transistors 46, 48 where emitters are commonly connected together and a pair of second stage transistors 50, 52 whose emitters are commonly connected together. A first clock transistor 54 has its collector tied to the common emitters of the transistor 46, 48 and its emitter tied to the current source 11. The base of the transistor 54 is coupled to a terminal for receiving a clock signal which has the same level as the enable signal LE'. Thus, the buffer circuit 28 of FIG. 3 can be used again to provide this clock signal and may be formed on the same integrated circuit substrate. A second clock transistor 56 has its collector coupled to the common emitters of the transistors 50, 52 and its emitter tied to a current source 16.

The junction of the first load resistor 13 and the collector of the reference transistor 12 defining a first output of the functional circuit portion is coupled to the base of the transistor 46, the collector of the transistor 48 and the base of the transistor 52 which form a first input of the master circuit portion 40. The junction of the second load resistor 15 and the common collectors of the input transistors 14 defining a second output of the functional circuit portion are joined to the collector of the transistor 46, the base of the transistor 48, and the base of the transistor 50 which form a second input of the master circuit portion 40. The collector of the transistor 52 is further joined to one end of a third load resistor 55, and to the collector of the second latch transistor 20. The other end of the resistor 55 is tied to a supply potential $V_{CC}$. The collector of the transistor 50 is further coupled to one end of a fourth load resistor 57 and to the collector of the first latch transistor 18. The other end of the load resistor 57 is tied to the supply potential $V_{CC}$. The bases of the first and second latch transistors 20 and 18 define the inputs of the latch circuit portion 44.

Figure 5:
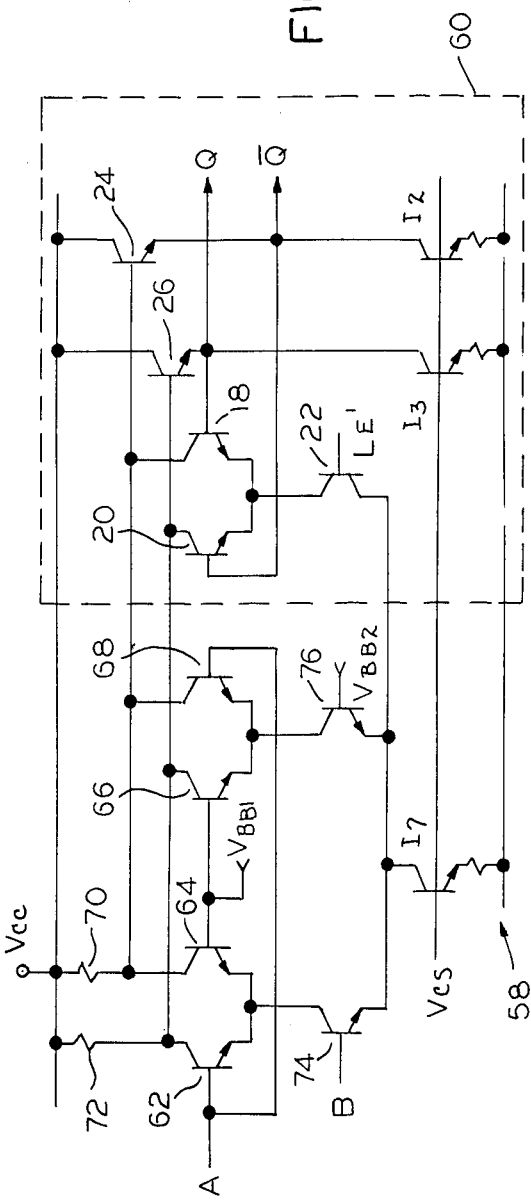
FIG. 5 is a schematic diagram of a combined EXCLUSIVE OR and latch circuit of the present invention.

A combined two-input EXCLUSIVE OR (XOR) and latch circuit 58 of the present invention is illustrated in FIG. 5 which is formed on an integrated circuit substrate of a semiconductor chip. The latch circuit within the dotted line 60 is identical to the latch circuit portion 10b of FIG. 2. The latch enable signal LE' is the signal from the buffer circuit 28 of FIG. 3. Thus, the detailed interconnection of the components in the latch circuit within the dotted line 60 will not be repeated. The EXCLUSIVE OR circuit portion includes a first pair of transistors 62, 64 whose emitters are commonly connected together and a second pair of transistors 66, 68 whose emitters are commonly connected together. The collectors of the transistors 64 and 68 are tied together and further coupled to one end of a load resistor 70. The common collectors of the transistors 64, 68 are further coupled to the base of the complementary output transistor 24. The collectors of the transistors 62 and 66 are tied together and further coupled to one end of a load resistor 72. The common collectors of the transistors 62, 66 are further coupled to the base of the true output transistors 26. The other ends of the load resistors 70, 72 are tied to a supply potential $V_{CC}$.

The bases of the transistors 62 and 68 are tied together and are further joined to a terminal for receiving a first input signal A. The bases of the transistors 64 and 66 are tied together and are further coupled to a terminal for receiving a first reference voltage $V_{BB1}$. The common emitter of the transistor 62, 64 are tied to the collector of a second input transistor 74. The base of the transistor 74 is connected to a terminal for receiving a second input signal B. The common emitters of the transistors 66, 68 are tied to the collector of a second reference 76. The base of the transistor 76 receives a second reference voltage $V_{BB2}$. The emitters of the transistors 74 and 76 are commonly tied together. A current source 17 is coupled to the common emitters of the transistors 74, 76.

From the foregoing detailed description, it can thus be seen that the present invention provides a combination circuit formed of a functional circuit portion coupled to a latch or flip-flop circuit portion which is fabricated as a single gate on an integrated circuit semiconductor chip for high speed operations. In particular, there is provided in the present invention a combined multiplexer and latch circuit which is formed as a single gate on a integrated circuit semiconductor chip. In another aspect of the present invention, there is provided a combined EXCLUSIVE OR and latch circuit constructed as a single gate.

While there has been illustrated and described what are at present considered to be preferred embodiments of the present invention, it will be understood by those skilled in the art that various changes and modifications may be made, and equivalents maybe substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments described as the best modes contemplated for carrying out this invention, but that the invention will include all embodiments falling within the scope of the appended claims.

What is claimed is:

1. A combination circuit formed of a functional circuit portion coupled to a latch circuit portion which is fabricated as a single gate on an integrated circuit semiconductor chip, said combination circuit comprising:
   a latch circuit portion including a pair of first and second latch transistors whose emitters are commonly connected;
   the bases of said first and second latch transistors being coupled to receive input signals from a master circuit portion;
   a latch enable transistor having its collector tied to the common emitters of said first and second latch transistors, its emitter connected to a first current source, and its base connected to a latch enable terminal;
   a first output transistor having its base connected to the collector of said first latch transistor, its collector connected to a supply potential and its emitter coupled to a true output signal terminal;
   a second output transistor having its base connected to the collector of said second latch transistor, its collector connected to the supply potential and its emitter coupled to a complementary output signal terminal;
   the emitter of said first output transistor being connected to the base of said second latch transistor and to a second current source and the emitter of said second output transistor being connected to the base of said first latch transistor and to a third current source;
   a functional circuit portion having inputs and outputs, the inputs of said functional circuit portion being coupled to receive data signals;
   a master circuit portion having inputs and outputs, the inputs of said master circuit portion being connected to the outputs of the functional circuit portion;
   the master circuit portion having its outputs coupled to the bases of said first and second latch transistors of said latch circuit portion to provide the input signals; and
   said master circuit portion and said latch portion forming a flip-flop circuit.

2. A combination circuit as claimed in claim 1, further comprising a clock buffer circuit which generates a clock signal for said flip-flop circuit.

3. A combination circuit as claimed in claim 1, wherein said functional circuit portion comprises a multiplexer circuit.

4. A combination circuit as claimed in claim 1, wherein said functional circuit portion comprises a logic circuit.

5. A combination circuit as claimed in claim 4, wherein said logic circuit is a two-input EXCLUSIVE OR gate.

6. A combination multiplexer and latch circuit formed of a latch circuit portion and a multiplexer circuit portion which is fabricated as a single gate on an integrated semiconductor chip, said combination circuit comprising:
   the latch circuit portion including a pair of first and second latch transistors whose emitters are commonly connected together;
   the bases of said first and second latch transistors being coupled to receive input signals from a multiplexer circuit portion;
   a latch enable transistor having its collector tied to the common emitters of said first and second latch transistors, its emitter connected to a first current source, and its base connected to a latch enable terminal;
   a first output transistor having its base connected to the collector of said first latch transistor, its collector connected to a supply potential and its emitter coupled to a true output signal terminal;
   a second output transistor having its base connected to the collector of said second latch transistor, its collector connected to the supply potential and its emitter coupled to a complementary output signal terminal;
   the emitter of said first output transistor being connected to the base of said second latch transistor and to a second current source and the emitter of said second output transistor being connected to the base of said first latch transistor and to a third current source; and
   the multiplexer circuit portion having its outputs coupled to the bases of said first and second latch transistors of said latch circuit portion to provide the input signals.

7. A combination circuit as claimed in claim 6, wherein said multiplexer portion includes a reference transistor, a plurality of data input transistors and a plurality of control transistors.

8. A combination circuit as claimed in claim 6, further comprising a latch enable buffer circuit which generates a latch enable signal.

9. A combination EXCLUSIVE OR and latch circuit formed as a single gate on an integrated circuit semiconductor chip, said combination circuit comprising:
   a latch circuit portion including a pair of first and second latch transistors whose emitters are commonly connected together;
   the bases of said first and second latch transistors being coupled to receive input signals form an EXCLUSIVE OR circuit portion;
   a latch enable transistor having its collector tied to the common emitters of said first and second latch transistors, its emitter connected to a first current source and its base connected to a latch enable terminal;
   a first output transistor having its base connected to the collector of said first latch transistor, its collector connected to a supply potential and its emitter coupled to a true output signal terminal;
   a second output transistor having its base connected to the collector of said second latch transistor, its collector connected to the supply potential and its emitter coupled to a complementary output signal terminal;
   the emitter of said first output transistor connected to the base of said latch transistor and to a second current source and the emitter of said second output transistor being connected to the base of said first latch transistor and to a third current source; and
   the EXCLUSIVE OR circuit portion having its outputs coupled to the bases of said first and second latch transistors to provide the input signals.

10. A combination circuit as claimed in claim 9, wherein said EXCLUSIVE OR circuit portion has two inputs.

11. A combination circuit as claimed in claim 9, further comprising a latch enable buffer circuit which generates a latch enable signal.

* * * * *